United States Patent [19]

Furuhata

[11] Patent Number: 5,233,503
[45] Date of Patent: Aug. 3, 1993

[54] PRESSURE-CONTACT TYPE SEMICONDUCTOR DEVICE

[75] Inventor: Shoichi Furuhata, Kanagawa, Japan

[73] Assignee: Fuji Electric Co., Ltd., Kanagawa, Japan

[21] Appl. No.: 773,407

[22] Filed: Oct. 9, 1991

[30] Foreign Application Priority Data

Oct. 16, 1990 [JP] Japan .................................. 2-277451

[51] Int. Cl.⁵ ............................................. H05K 7/02
[52] U.S. Cl. ..................... 361/783; 361/761; 361/408; 361/776; 257/688; 174/260
[58] Field of Search ............... 361/400, 401, 408, 414, 361/417, 396; 357/79, 80, 68; 174/260, 255; 257/686, 688, 690, 700, 701, 703, 784

[56] References Cited

U.S. PATENT DOCUMENTS 4,489,364 12/1984 Chance et al. ....................... 361/395
4,546,413 10/1985 Feinberg et al. ..................... 361/410

Primary Examiner—Leo P. Picard
Assistant Examiner—Young S. Whang
Attorney, Agent, or Firm—Finnegan, Henderson, Farabow, Garrett & Dunner

[57] ABSTRACT

A pressure-contact type semiconductor device with pressure-contact electrodes for external connection is disclosed. The pressure-contact electrodes are mounted through an insulating material on a metal substrate having semiconductor elements mounted thereon side-by-side. The pressure-contact electrodes are wire-bonded to the terminals of the semiconductor elements. Flexible insulating sheets are inserted between the metal substrate and the pressure-contact electrode and between the pressure-contact electrodes respectively. The insulating sheets are fixed onto the metal substrate and the pressure-contact electrodes through an adhesive.

9 Claims, 2 Drawing Sheets

PRESSURE-CONTACT TYPE SEMICONDUCTOR DEVICE

BACKGROUND OF THE INVENTION

1. Field of the Invention

The present invention relates to the configuration of a pressure-contact type semiconductor device to be applied to a flat MOS-FET or the like.

2. Discussion of the Related Art

Pressure-contact type semiconductor devices have been mainly applied as power semiconductor devices having large current capacity, and the configuration thereof has been variously changed depending on the kind of device (MOS-FETs, GTO thyristors, and so on).

Semiconductor devices having a flat pressure-contact structure applied to MOS-FET chips are mounted on a metal substrate with the drain electrode surfaces facing downward, and pressure-contact electrodes for the source and gate are mounted on the metal substrate through an insulating material side-by-side with the chips. The pressure-contact electrodes are wire-bonded to the source and gate terminals of the semiconductor elements.

In the case of forming a module by using such a flat MOS-FET, packaging is performed in a manner so that the metal substrate is mounted on a heat-radiation plate of the module and another external connection plate is made to pressure-contact with the upper surface of each of the pressure-contact electrodes connected to the source and the gate. In the packaged state, the pressing force is not exerted to the semiconductor element chips at all but is exerted only to the pressure-contact electrodes.

In conventional pressure-contact type semiconductor devices, a ceramic plate is used as the insulating material and is soldered with opposite side members like a generally-used semiconductor module. Specifically, opposite surfaces of the ceramic plate are metallized in advance and the metal substrate and the pressure-contact electrode are bonded to each other, for example, with space solder or a soldering sheet interposed therebetween through a reflowing soldering method.

Conventional pressure-contact type semiconductor devices having a ceramic plate interposed between the metal substrate and the pressure-contact electrode and bonded to the opposite side members by soldering have experienced problems. If the soldering is performed in the state where the ceramic plate and the pressure-contact electrode are piled up on the metal substrate, it is very difficult to maintain correct parallelism between the plate surface of the metal substrate and the end surface of the pressure-contact electrode. The difficulty in maintaining parallelism arises because of bending due to strain caused by the thermal expansion difference between metal and ceramic or because of unevenness in the thickness of the soldering layer.

In pressure-contact attachment of the foregoing assembly, problems have resulted if correct parallelism between the metal substrate and the pressure-contact electrode mounted on the former is not held as described above. The problems include:

(1) Since the pressing force is not applied uniformly but partially in the pressure-contact state, scattering occurs locally in electrical contact resistance and thermal resistance, so that the operating characteristics of the semiconductor device becomes unstable; and (2) Scattering occurs locally also in the pressing force to be applied onto the ceramic plate so that the bending stress acts on the ceramic plate to cause cracks, which may cause serious defects such as reduction in dielectric strength.

SUMMARY OF THE INVENTION

The present invention has been accomplished in view of the foregoing problems, and an object of the present invention is to provide a pressure-contact type semiconductor device that avoids the cracking problems of the conventional device and is as highly reliable.

Additional objects and advantages of the present invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purposes of the invention, as embodied and broadly described herein, a pressure-contact type semiconductor device comprises a substrate having a plurality of semiconductor elements mounted thereon, each of the semiconductor elements including at least one terminal, a plurality of pressure-contact electrodes for externally connecting the semiconductor elements, means for connecting the pressure-contact electrodes to the terminals of said semiconductor elements, means for insulating the pressure-contact electrodes from the substrate and from each other, and means for adhesively affixing the insulating means to the substrate and the pressure-contact electrodes.

BRIEF DESCRIPTION OF THE DRAWINGS

The accompanying drawings, which are incorporated in and constitute a part of this specification illustrate an embodiment of the invention and, together with the description, serve to explain the objects, advantages, and principles of the invention. In the drawings.

DETAILED DESCRIPTION OF THE PREFERRED EMBODIMENT

Figure 1:
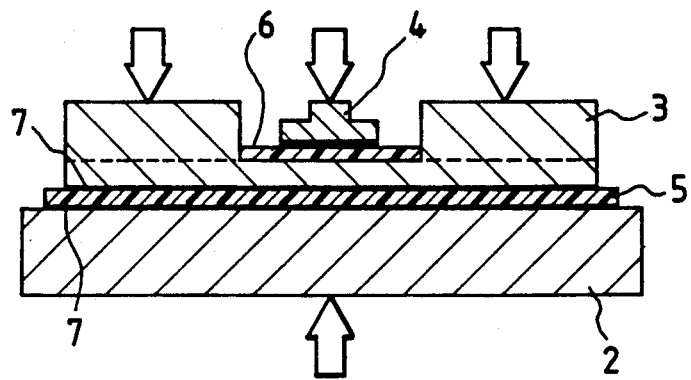
FIG. 1 is a sectional view of the pressure-contact type semiconductor device of the present invention taken along reference line 1—1 of FIG. 2.

In order to solve the problems of the prior art, the pressure-contact type semiconductor device according to the present invention is configured such that as the insulating material, flexible sheets are inserted respectively between pressure-contact electrodes and a metal substrate and the pressure-contact electrode, and the insulating sheets are fixed to the opposite-side members through an adhesive.

In the case of the semiconductor elements having main and control electrodes like a MOS-FET, a configuration can be made such that the pressure-contact electrodes respectively connected to the main and control electrodes of the semiconductor elements are mounted on the metal substrate in a manner so that the pressure-contact electrode at the control electrode side is put on the upper side of the pressure-contact electrode at the main electrode side.

In the foregoing piled-up structure of the pressure-contact electrodes, in order to obtain a surge absorption effect on the semiconductor elements, the electrostatic (dielectric) constant of the insulating sheet interposed between the metal substrate and the pressure-contact electrode connected to the main electrodes is made different from the electrostatic (dielectric) constant of the insulating sheet interposed between the pressure-contact electrodes connected to the main and control electrodes to thereby make it possible to provide cooperation of the electrostatic capacity.

The flexible insulating sheets may comprise a sheet of polyester or polyimide film having a thickness of about 0.1 mm, which is superior in heat resistance, dielectric strength, and mechanical strength. In assembling the semiconductor device, an adhesive is applied onto the opposite surfaces of the insulating sheets and the insulating sheets are inserted between the metal substrate and the pressure-contact electrode and between the pressure-contact electrodes. The adhesive is then hardened while the assembled body is held in the pressed state so as to maintain correct parallelism between the metal substrate and the pressure-contact electrodes. As a result, correct parallelism is ensured between the metal substrate and the pressure-contact electrodes mounted thereon, so that external pressing force is uniformly exerted onto the metal substrate and the pressure-contact electrode surface in the state where the semiconductor device is attached in the state of pressure-contact.

The dielectric constants of the insulating sheets are suitably selected to adjust the electrostatic capacity between the metal substrate and the pressure-contact electrodes so as to make the semiconductor device have a function similar to a snubber circuit so that external surge can be absorbed and be limited to a value not larger than the surge withstanding strength of the semiconductor elements. Particularly in the case of the semiconductor elements having main electrodes (source and drain) and control electrodes (gate) like MOS-FETs, the pressure-contact electrodes for the main and control electrodes are mounted on the metal substrate in a manner so that the pressure-contact electrode for the main electrodes is put on the upper side of the pressure-contact electrode for the control electrode in the piled-up state. The dielectric constants of the insulating sheets interposed between the metal substrate and the pressure-contact electrode and between the pressure-contact electrodes are selected separately from each other to perform cooperation of electrostatic capacity to obtain a high surge absorption effect between the main electrodes (between the source and the drain) while minimizing the influence of the parasitic capacity between the control electrodes (between the gate and the drain) on the operating characteristics.

An embodiment of the present invention will now be described with reference to the accompanying drawings.

Figure 2:
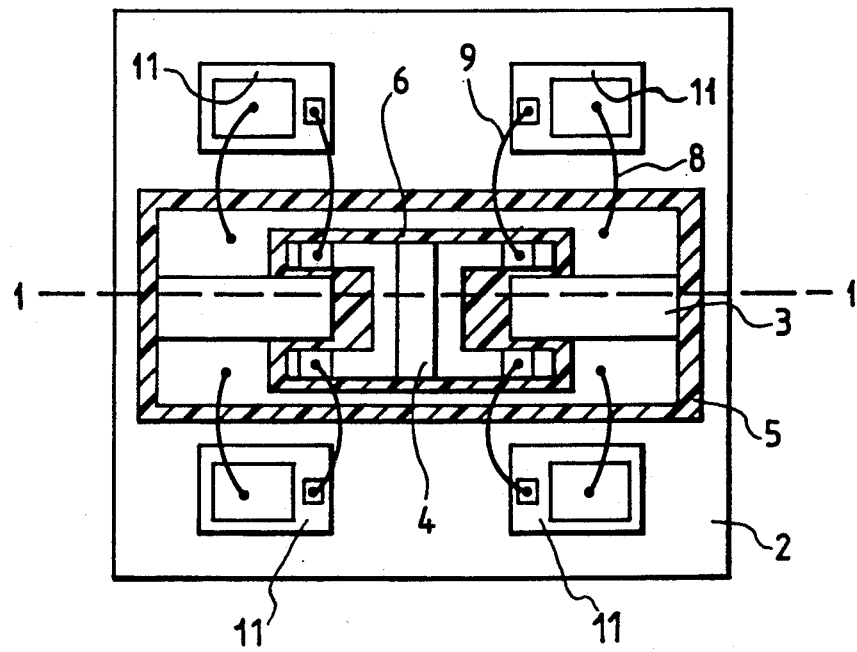
FIG. 2 is a plan view of the pressure-contact semiconductor device of the present invention.
Figure 3:
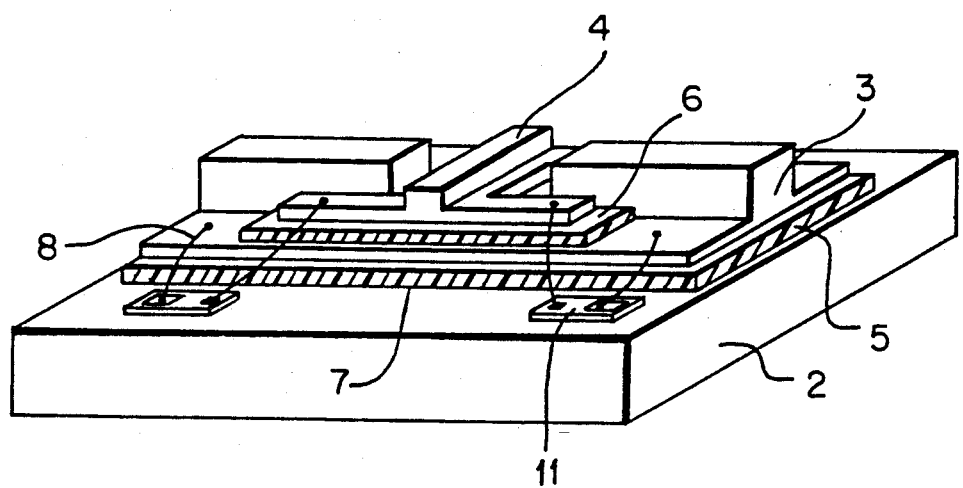
FIG. 3 is a perspective view of the semiconductor device of FIGS. 1 and 2.

FIGS. 1 and 2 show an embodiment of a flat MOS-FET, including a semiconductor element 1 (a MOS-FET chip), and a metal substrate 2 (used also as a drain external electrode of the MOS-FET) on which a plurality of semiconductor elements 1 are mounted in a spaced manner. Piled-up pressure-contact electrodes 3 and 4 provide a source and a gate, respectively. The pressure-contact electrodes 3 and 4 are collectively mounted on the metal substrate 2 at the central portion thereof side by side with the semiconductor elements 1. Insulating sheets 5 and 6 are inserted between the metal substrate 2 and the pressure-contact electrode 3 and between the pressure-contact electrodes 3 and 4. Each sheet may formed by, for example, a 0.1 mm thick polyester or polyimide film which is superior in heat resistance, dielectric strength, and mechanical strength. Adhesive 7 is provided for fixing the insulating sheets 5 and 6 to their opposite side members.

The pressure-contact electrode 4 for the gate provided on the upper side is put on the pressure-contact electrode 3 for the source so as to be recessed in a central notched portion of the electrode 3 as shown in the drawing. The respective heights of the pressure-contact electrodes 3 and 4 are established to be even with each other at their upper end surfaces. The pressure-contact electrodes 3 and 4 are wire-bonded to the source and gate terminals of the MOS-FET through aluminum wires 8 and 9 respectively.

The assembled semiconductor device is sandwiched between a cooling body and an external connection plate so as to be held in a pressure-contact state. Further, in a packaged state of such pressure-contact attachment, pressing force is externally exerted onto the lower surface of the metal substrate 2 and the upper surfaces of the pressure-contact electrodes 3 and 4 as shown by arrows in FIG. 1.

In this case, the very thin flexible insulating sheets 5 and 6 are used as the insulating materials to be interposed between the metal substrate 2 and the pressure-contact electrode 3 and between the pressure-contact electrodes 3 and 4. Since the adhesive 7 is hardened while the metal substrate 2 and the pressure-contact electrodes 3 and 4 are held in a pressed state so as to maintain the parallelism therebetween, the parallelism between the metal substrate 2 and each of the pressure-contact electrodes 3 and 4 is ensured. Therefore, the external pressing force is uniformly exerted onto the pressure-contact surfaces. Further, since no ceramic insulating plate is used, there is no possibility of cracks developing in the plate or of a reduction in insulation dielectric strength.

Moreover, the pressure-contact electrodes 3 and 4 are collectively mounted on the metal substrate 2 at its central portion in the piled-up state and the chips of the semiconductor elements 1 are symmetrically and dispersedly disposed in the periphery of the piled-up pressure-contact electrodes 3 and 4, as illustrated in the foregoing embodiment, so that the respective lengths of the wires 8 and 9 for connecting the pressure-contact electrodes 3 and 4 and the semiconductor elements 1 are equal to each other and are minimized. As a result, the influence of the wiring inductance can be reduced so as to be almost negligible.

Furthermore, by suitably selecting the dielectric constants of the insulating sheets 5 and 6 to adjust the electrostatic capacity between the external electrodes (between the source and the drain), the externally applied surge can be absorbed so as to be limited to a value not larger than the surge withstanding strength of the semiconductor element 1 as if a snubber circuit is provided. In the structure of the illustrated embodiment applied to an MOS-FET (the structure in which the pressure-contact electrodes 5 and 6 are piled on the metal substrate 2 so that the pressure-contact electrode 4 for the gate is disposed on the upper side of the pressure-contact electrode 3), by changing the respective dielectric constants of the insulating sheets 3 and 4 separately from each other to thereby provide cooperation of the electrostatic capacity, a high surge absorption effect between the source and the drain can be obtained while the parasitic capacity between the gate and the drain is minimized. This surge absorption effect effectively acts, particularly, on the semiconductor device for high-frequency use.

When configured as described above, the pressure-contact type semiconductor device according to the present invention shows the following effects. The flexible insulating sheet 5 is used as the insulating material to be interposed between the metal substrate 2 and pressure-contact electrode 3 and is fixed to the opposite side members by using an adhesive 7. Therefore, the parallelism between the metal substrate 2 and the pressure-contact electrode 3 is ensured to make it possible to apply a pressing force uniformly in pressure-contact attachment, so that the operating characteristic of the pressure-contact type semiconductor device is stabilized to improve the reliability of the semiconductor device.

Further, in the case of a semiconductor device having a control electrode as shown in the foregoing embodiment, the configuration is such that the pressure-contact electrodes 3 and 4 connected to the main and control electrodes are piled up and collectively mounted on the metal substrate 2 at its central portion and the semiconductor elements 1 are symmetrically disposed in the periphery of the piled-up pressure-contact electrodes 3 and 4. As a result, the length of wires 8 and 9 for connecting the pressure-contact electrodes 3 and 4 and the semiconductor elements 1 to each other is minimized so that influence of the wiring inductance can be substantially eliminated.

Moreover, the dielectric constant of the insulating sheet 6 to be interposed between the pressure-contact electrodes 3 and 4 in the foregoing configuration is suitably selected to adjust the electrostatic capacity between the electrodes 3 and 4. Thus, it is possible to limit the external surge to a value not larger than the surge-withstanding strength of the semiconductor elements.

The foregoing description of preferred embodiment(s) of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A pressure-contact type semiconductor device comprising:
   a substrate having a plurality of semiconductor elements mounted thereon, each semiconductor element including at least one terminal;
   first and second pressure-contact electrodes for externally connecting said semiconductor elements;
   means for connecting said first and second pressure-contact electrodes to said terminal of each of said semiconductor elements;
   first means for insulating said first pressure-contact electrode from said substrate;
   second means for insulating said first pressure-contact electrode from said second pressure-contact electrode; and
   means for adhesively affixing said first insulating means to said substrate and said first pressure-contact electrode and for adhesively affixing said second insulating means to said first and second pressure-contact electrodes.

2. The pressure-contact type semiconductor device according to claim 1, wherein said substrate is a metal substrate.

3. The pressure-contact type semiconductor device according to claim 1, wherein said semiconductor elements are arranged side-by-side.

4. The pressure-contact type semiconductor device according to claim 1, wherein said means for insulating is a polyester sheet material having a thickness of about 0.1 mm.

5. The pressure-contact type semiconductor device according to claim 1, wherein said means for insulating is a polyimide film having a thickness of about 0.1 mm.

6. The pressure-contact type semiconductor device according to claim 1, wherein said means for insulating is a ceramic free material.

7. The pressure-contact type semiconductor device according to claim 1, wherein said means for connecting said pressure-contact electrodes to said terminals are aluminum wires.

8. The pressure-contact type semiconductor device according to claim 1, wherein each of said plurality of semiconductor elements includes a main terminal and a control terminal, said first pressure-contact electrode is connected to said main terminal of each of said plurality of semiconductor elements, said second pressure-contact electrode is connected to said control terminal of each of said plurality of semiconductor elements, and said second pressure-contact electrode is provided on an upper side of said first pressure-contact electrode.

9. The pressure-contact type semiconductor device according to claim 8 wherein said first insulating means and said second insulating means have different dielectric constants.

* * * * *